US010680023B2

(12) United States Patent
Rudmann et al.

(10) Patent No.: US 10,680,023 B2
(45) Date of Patent: Jun. 9, 2020

(54) OPTOELECTRONIC MODULES HAVING A SILICON SUBSTRATE, AND FABRICATION METHODS FOR SUCH MODULES

(71) Applicant: ams Sensors Singapore Pte. Ltd., Singapore (SG)

(72) Inventors: Hartmut Rudmann, Jona (CH); Mario Cesana, Au (CH); Jens Geiger, Thalwil (CH); Peter Roentgen, Thalwil (CH); Vincenzo Condorelli, Altendorf (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/357,627

(22) Filed: Mar. 19, 2019

(65) Prior Publication Data

US 2019/0326340 A1 Oct. 24, 2019

Related U.S. Application Data

(60) Continuation of application No. 15/622,813, filed on Jun. 14, 2017, now Pat. No. 10,283,542, which is a division of application No. 14/823,174, filed on Aug. 11, 2015, now Pat. No. 9,711,552.

(60) Provisional application No. 62/056,897, filed on Sep. 29, 2014, provisional application No. 62/039,028, filed on Aug. 19, 2014.

(51) Int. Cl.
*H01L 27/14* (2006.01)
*H01L 27/146* (2006.01)

(52) U.S. Cl.
CPC .. *H01L 27/14625* (2013.01); *H01L 27/14618* (2013.01); *H01L 27/14621* (2013.01); *H01L 27/14685* (2013.01)

(58) Field of Classification Search
CPC ......... H01L 27/14625; H01L 27/14618; H01L 27/14621; H01L 27/14685
USPC ..................... 257/98; 438/22, 25, 26, 27, 29
See application file for complete search history.

(56) References Cited

U.S. PATENT DOCUMENTS

| 2002/0074650 A1 | 6/2002 | Takahashi et al. |
| 2003/0059178 A1 | 3/2003 | Kobayashi |
| 2003/0189213 A1 | 10/2003 | Igaki |
| 2008/0230934 A1 | 9/2008 | Rudmann et al. |
| 2008/0278617 A1 | 11/2008 | Tanida et al. |
| 2011/0013292 A1* | 1/2011 | Rossi ................ H01L 27/14621 359/738 |
| 2011/0085076 A1 | 4/2011 | Fujimori |
| 2011/0211102 A1 | 9/2011 | Yamada et al. |
| 2012/0194923 A1 | 8/2012 | Um |

(Continued)

FOREIGN PATENT DOCUMENTS

| JP | 2008-283002 A | 11/2008 |
| JP | 2011-082924 A | 4/2011 |

(Continued)

*Primary Examiner* — Didarul A Mazumder
(74) *Attorney, Agent, or Firm* — Michael Best & Friedrich LLP

(57) ABSTRACT

Optoelectronic modules include a silicon substrate in which or on which there is an optoelectronic device. An optics assembly is disposed over the optoelectronic device, and a spacer separates the silicon substrate from the optics assembly. Methods of fabricating such modules also are described.

9 Claims, 10 Drawing Sheets

(56) References Cited

U.S. PATENT DOCUMENTS

| | | | |
|---|---|---|---|
| 2013/0019461 A1* | 1/2013 | Rudmann | H01L 25/167 29/592.1 |
| 2013/0033767 A1* | 2/2013 | Rudmann | B29D 11/00375 359/722 |
| 2013/0037831 A1* | 2/2013 | Rudmann | H01L 25/167 257/88 |
| 2013/0044380 A1 | 2/2013 | Shen et al. | |
| 2013/0242182 A1* | 9/2013 | Rudmann | B29D 11/00307 348/374 |
| 2013/0267273 A1* | 10/2013 | Rudmann | G01S 17/04 455/556.1 |
| 2013/0334445 A1* | 12/2013 | Tharumalingam | H01L 25/167 250/552 |
| 2014/0125849 A1* | 5/2014 | Heimgartner | H01L 31/02325 348/276 |
| 2014/0240590 A1 | 8/2014 | Fujimori | |
| 2014/0299587 A1* | 10/2014 | Rudmann | H01L 27/14618 219/121.69 |
| 2015/0034995 A1 | 2/2015 | Munding et al. | |
| 2015/0279827 A1 | 10/2015 | Tu et al. | |

FOREIGN PATENT DOCUMENTS

| | | |
|---|---|---|
| WO | 2012/022000 | 2/2012 |
| WO | 2013/026175 | 2/2013 |
| WO | 2013/091829 | 6/2013 |
| WO | 2014/070015 A | 5/2014 |
| WO | 2015/016776 | 2/2015 |

\* cited by examiner

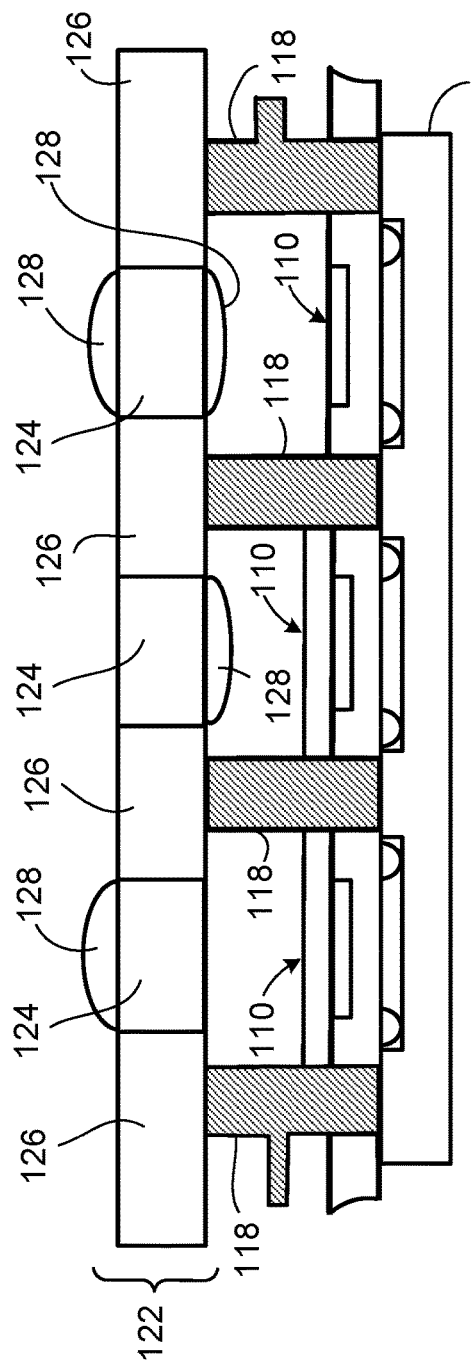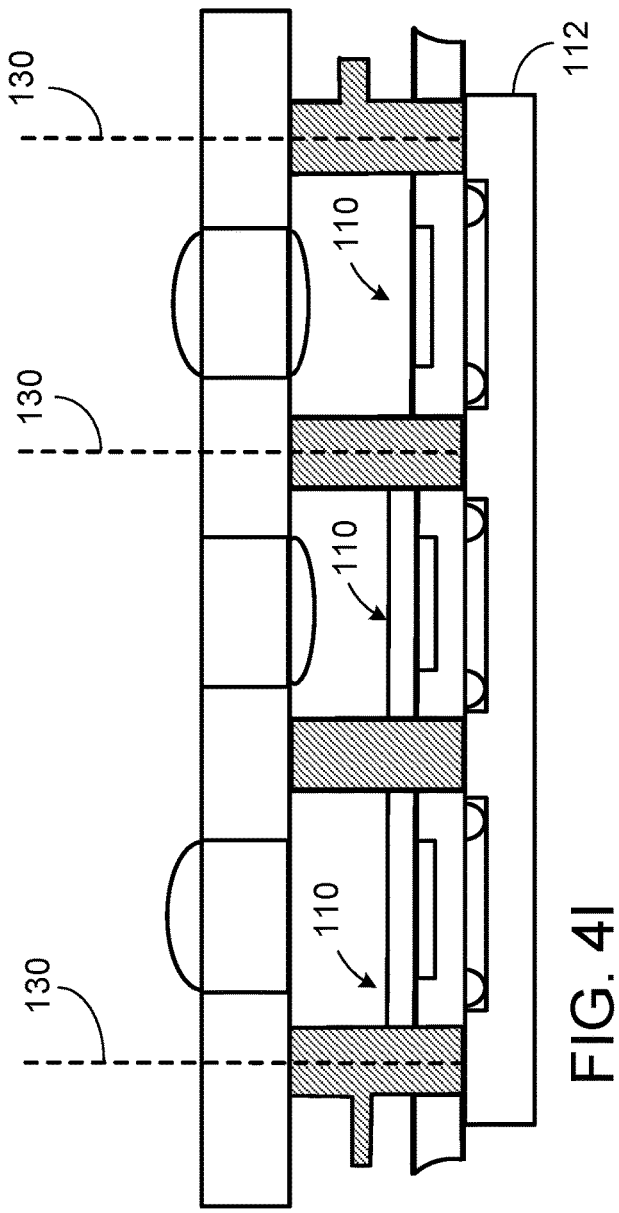

OPTOELECTRONIC MODULES HAVING A SILICON SUBSTRATE, AND FABRICATION METHODS FOR SUCH MODULES

CROSS-REFERENCE TO RELATED APPLICATIONS

This application claims the benefit of U.S. Provisional Application No. 62/039,028, filed Aug. 19, 2014 and U.S. Provisional Application No. 62/056,897, filed Sep. 29, 2014, all of which are incorporated herein by reference in their entirety.

FIELD OF THE DISCLOSURE

This disclosure relates to optoelectronic modules having a silicon substrate, and fabrication methods for such modules.

BACKGROUND

Smartphones and other devices sometimes include miniaturized optoelectronic modules such as light modules, sensors or cameras. Light modules can include a light emitting element such as a light emitting diode (LED), an infra-red (IR) LED, an organic LED (OLED), an infra-red (IR) laser or a vertical cavity surface emitting laser (VCSEL) that emits light through a lens to outside the device. Other modules can include a light detecting element. For example, CMOS and CCD image sensors can be used in primary or front facing cameras. Likewise, proximity sensors and ambient light sensors can include a light sensing element such as a photodiode. The light emitting and light detecting modules as well as cameras can be used in various combinations. Thus, for example, a light module such as a flash module can be used in combination with a camera that has an imaging sensor. Light emitting modules in combination with light detecting modules also can be used for other applications such as gesture recognition or IR illumination.

Although various module designs have been proposed, there is a constant need in the industry to improve various aspects of such modules. For example, space in the devices for which the modules are designed often is at a premium. Thus, it is desirable for the module to have as a small a footprint as practicable. Further, poor transfer of heat away from the modules can be problematic in some cases. Likewise, in some situations, when temperatures vary from nominal values, the module's optical properties may become degraded.

SUMMARY

This disclosure describes optoelectronic modules having a silicon substrate, and fabrication methods for such modules.

One or more of the following advantages are provided by some implementations. For example, by using a silicon substrate in which various electronic and/or optoelectronic components can be formed, the module can have as a relatively small footprint. The overall cost of the module can be reduced in some cases by eliminating the need for (and cost of) a printed circuit board substrate. Likewise, in some instances, at least some wiring to the substrate that might otherwise be required can be avoided by using a silicon substrate. Further, as the thermal conductivity of silicon is relatively high, heat transfer away from the module can be improved. Also, in view of silicon's coefficient of thermal expansion, using a silicon substrate can help reduce degradation of the module's optical properties when temperatures vary from nominal values.

Depending on the application, a module may have a single optical channel or multiple optical channels. For example, according to one aspect, an optoelectronic module includes a silicon substrate in which or on which there is an optoelectronic device. An optics assembly is disposed over the optoelectronic device. A spacer separates the silicon substrate from the optics assembly.

The spacer preferably is substantially opaque to, or significantly attenuates, light at wavelengths emitted and/or detectable by the optoelectronic device, which may be implemented as a light emitting element formed in, or mounted on, the silicon substrate or as a light detecting element formed in the silicon substrate. In some implementations, the spacer laterally surrounds, and is in direct contact with, the silicon substrate and may extend beyond an exterior surface of the silicon substrate. Other optical features such as optical filters or focal length correction layers may be provided as well.

In another aspect, an optoelectronic module includes a first optical channel and a second optical channel. A first optoelectronic device in the first optical channel is integrated in or disposed on first silicon substrate, and a second optoelectronic device in the second optical channel is integrated in or disposed on a second silicon substrate. First and second optics assemblies are disposed, respectively, over the first and second optoelectronic devices. A spacer separates the silicon substrates from the optics assemblies, and a portion of the spacer separates the first and second channels from one another. The spacer laterally surrounds, and is in direct contact with, the first and second silicon substrates.

In some instances, the first optics assembly is disposed on the spacer at a first distance from the first substrate, and the second optics assembly is disposed on the spacer at a different second distance from the second substrate. In some cases, the first and second optics assemblies form a laterally contiguous array of optical assemblies.

The present disclosure also describes methods of fabricating optoelectronic modules. For example, in some implementations, a wafer-level method includes applying upper and lower vacuum injection tools to a plurality of optoelectronic devices each of which is integrated in or disposed on a respective silicon substrate. The tools define spaces separating the silicon substrates from one another. The method further includes injecting a polymer material into the spaces, and curing the polymer material to form a spacer. One or more optics assemblies are attached to the spacer so as to obtain a resulting structure in which each of the one or more optics assemblies is disposed over at least one of the optoelectronic devices. The resulting structure then is separated into a plurality of optoelectronic modules each of which includes at least one optical channel.

Other aspects, features and advantages will be readily apparent form the following detailed description, the accompanying drawings, and the claims.

BRIEF DESCRIPTION OF THE DRAWINGS

FIGS. 4A-4I illustrate steps in a wafer-level method of fabricating optoelectronic modules.

DETAILED DESCRIPTION

Figure 1:
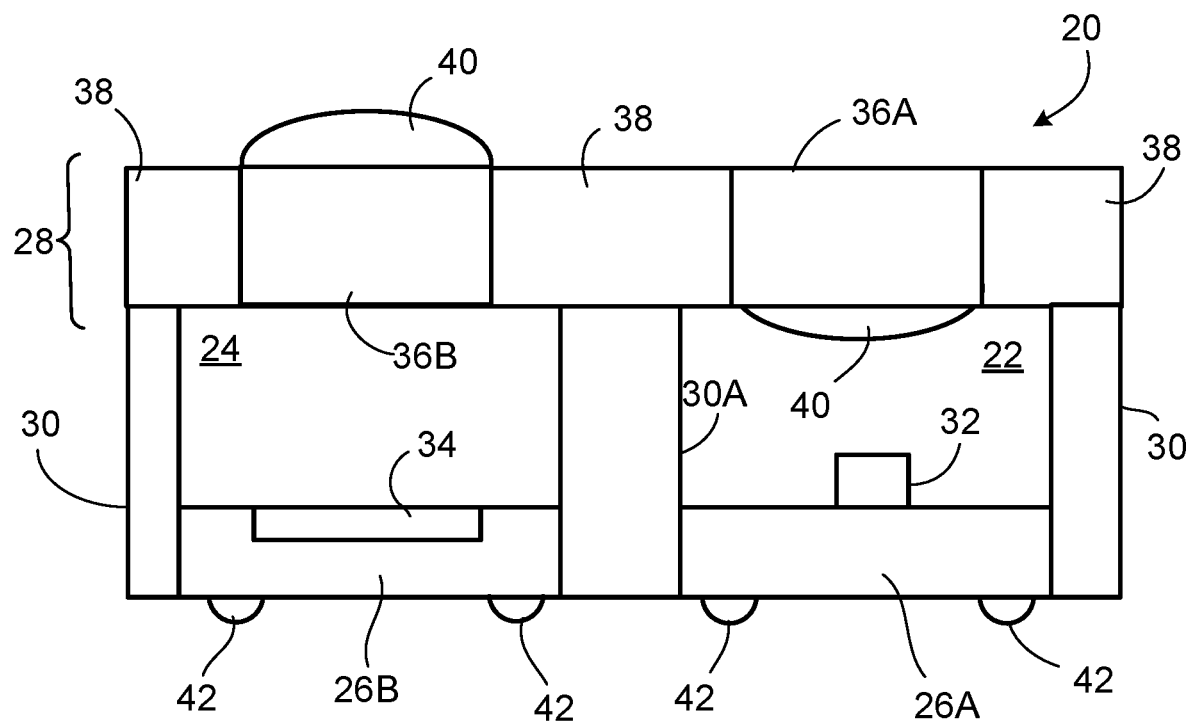
FIG. 1 is an example of a multi-channel optoelectronic module.

As shown in FIG. 1, a first example of an optoelectronic module 20 includes an array of optical channels. In the illustrated example, the module 20 includes an emission channel 22 and a detection channel 24. The module 20 has silicon substrates 26A, 26B, which are separated from an optics assembly 28 by a spacer 30. Thus, interior regions of the module 20 are bounded by the substrates 26A, 26B, the spacer 30 and the optics assembly 28.

Different portions of each silicon substrate 26A, 26B may exhibit different electronic and/or optoelectronic properties. A respective active optoelectronic device is integrated in, or disposed on, each silicon substrate 26A, 26B. For example, a light emitting element 32 (e.g., a LED, a laser diode or a series of LEDs or laser diodes) can be formed in, or mounted on, the silicon substrate 26A in the emission channel 22. Likewise, a single light detecting element (e.g., a photodiode) or an array of light detecting elements 34 (e.g., pixels of a CMOS sensor) can be formed in the silicon substrate 26B in the detection channel 24. In some instances, additional circuit components may be formed in the silicon substrates 26A, 26B.

The spacer 30 laterally surrounds the optoelectronic devices 32, 34 and serves as sidewalls for the module. Further, part 30A of the spacer serves as an interior wall that separates the emission and detection channels 22, 24 from one another. The spacer 30 (including the interior wall portion 30A) preferably is substantially opaque to, or significantly attenuates, light at wavelengths emitted by the light emitting element 32 and/or detectable by the light detection element 34. For example, in some cases, the spacer 30 is composed of a polymer material (e.g., epoxy, acrylate, polyurethane, or silicone) containing a non-transparent filler (e.g., carbon black, pigment, or dye). As illustrated in FIG. 1, the spacer 30 also laterally surrounds, and is in direct contact with, the silicon substrates 26A, 26B, and the interior wall portion 30A of the spacer separates the two silicon substrates 26A, 26B from one another. These features can be advantageous, in some instances, by providing electrical isolation of the module from adjacent semiconductor components and by providing structural support that can help prevent the silicon substrates from chipping.

Details of the optics assembly 28 may depend on the particular application, In the example of FIG. 1, the optics assembly 28 includes transmissive covers 36A, 36B that are laterally embedded within substantially opaque material 38. The transmissive covers 36A, 36B can be composed, for example, of glass, sapphire or a polymer material. The transmissive covers 36A, 36B generally are transparent to wavelengths of light emitted or detectable by the optoelectronic devices 32, 34. The opaque sections 38 can be composed, for example, of the same material as the spacer 30 or some other substantially non-transparent material. Each transmissive cover 36A, 36B can have one or more optical elements 40 such as lenses or other beam shaping elements formed thereon. Other examples of optics assemblies are described below.

The exterior side of each silicon substrate 26A, 26B can be provided with one or more solder bumps or other conductive contacts 42 (e.g., a ball grid array), which can be coupled electrically to a respective one of the optoelectronic devices 32, 34 in a known manner. Some implementations include through-silicon vias for the electrical connections.

Figure 2:
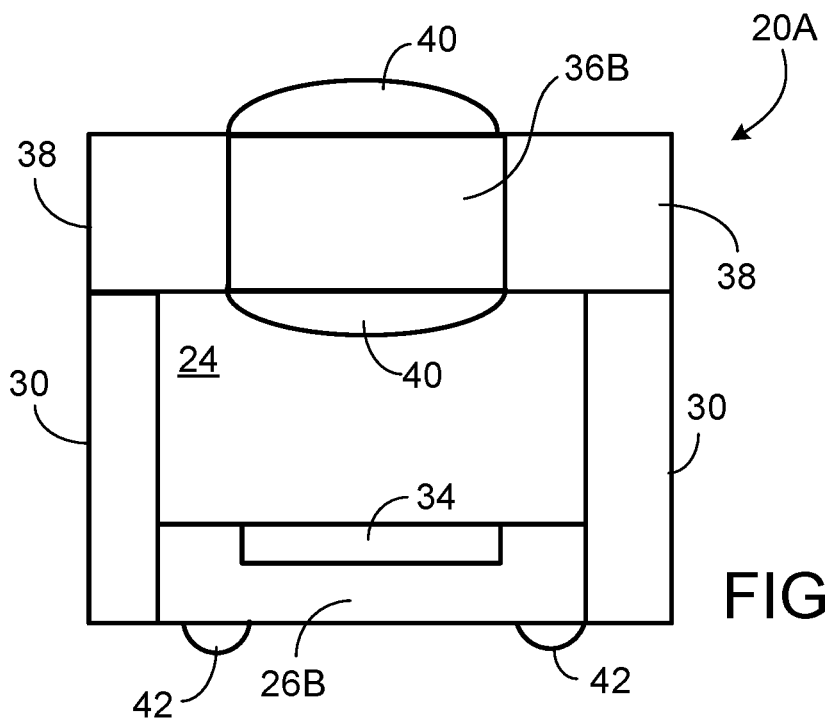
FIG. 2 is an example of a single channel optoelectronic module.

In some implementations, a module may include only a single optical channel. For example, as shown for example, in FIG. 2, the module 20A has a single optical detection channel and includes a light detection element 34. In other cases, the module may have a single optical emission channel and may include a light emitting element 32.

Figure 3:
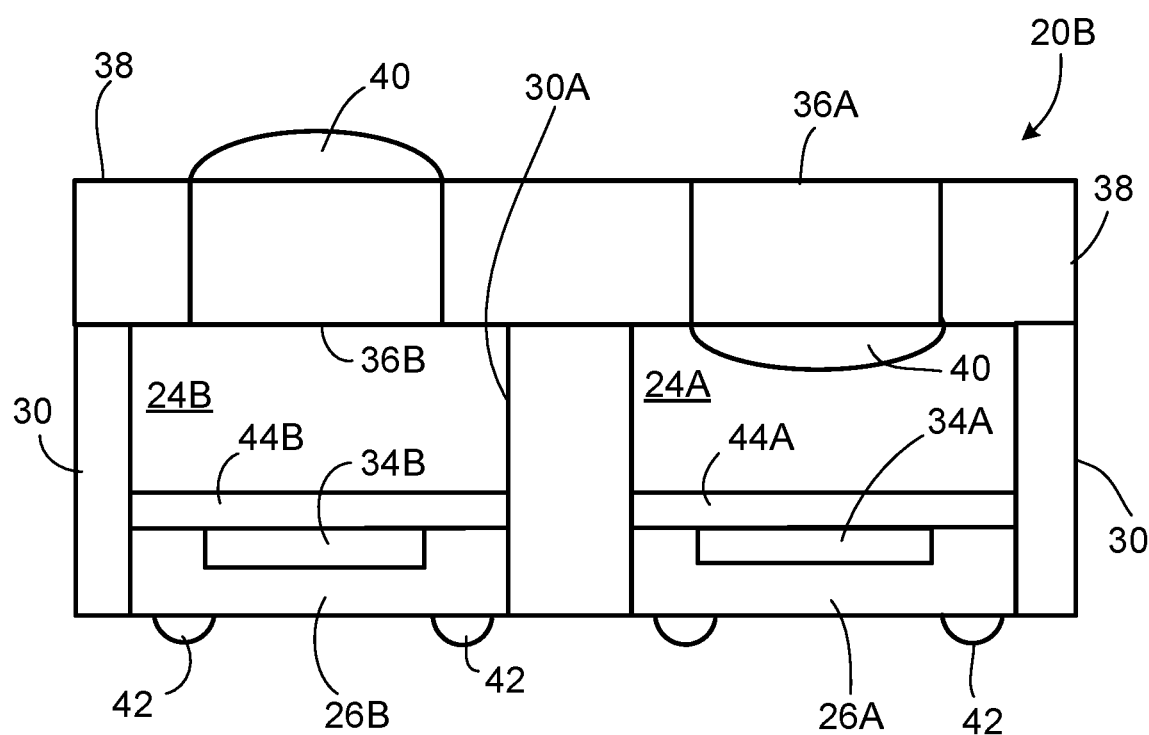
FIG. 3 is another example of a multi-channel optoelectronic module.

In some instances, an optical filter is provided in or more of the channels. For example, as shown in FIG. 3, a module 20B includes two detection channels 24A, 24B. A first optical filter 44A is disposed over a first light sensor 34A, and a second optical filter 44B is disposed over a second light sensor 34B. The first and second filters 44A, 44B may allow the same wavelength (or range of wavelengths) to pass or may be tailored to allow different wavelengths (or ranges of wavelengths) to pass. Thus, for example, the optical filters may include color filter arrays, IR-cut filters, band-pass filters, monochrome filters, or no filters.

The foregoing modules can be fabricated, for example, in a wafer-level process. Wafer-level processes allow multiple modules to be fabricated in parallel at the same time. Generally, a wafer refers to a substantially disk- or plate-like shaped item, its extension in one direction (y-direction or vertical direction) is small with respect to its extension in the other two directions (x- and z- or lateral directions). In some implementations, the diameter of the wafer is between 5 cm and 40 cm, and can be, for example, between 10 cm and 31 cm. The wafer may be cylindrical with a diameter, for example, of 2, 4, 6, 8, or 12 inches, one inch being about 2.54 cm. In some implementations of a wafer level process, there can be provisions for at least ten modules in each lateral direction, and in some cases at least thirty or even fifty or more modules in each lateral direction. The following paragraphs describe an example of such a wafer-level fabrication process for manufacturing optoelectronic modules such as those described above.

Figure 4A:
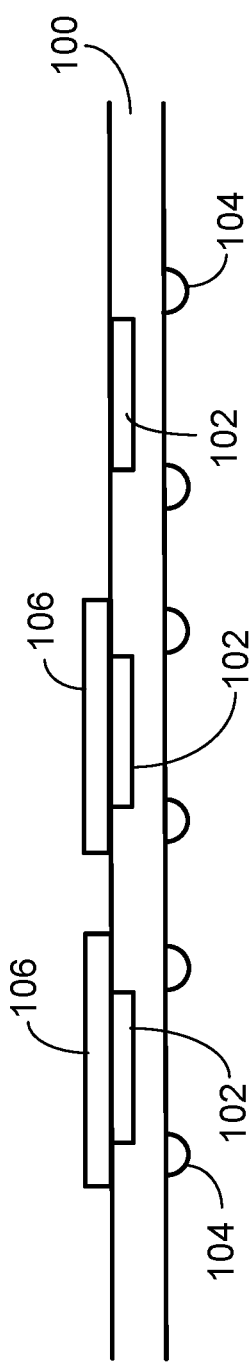
Figure 4B:
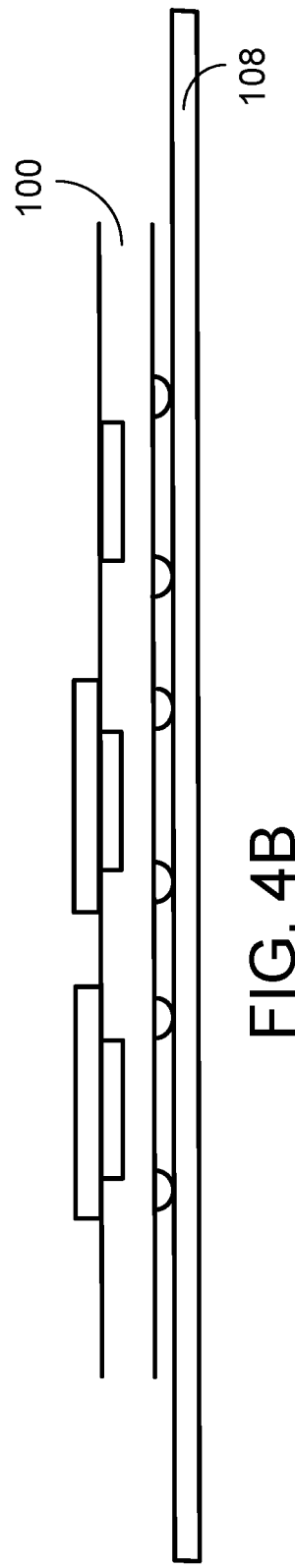
Figure 4C:
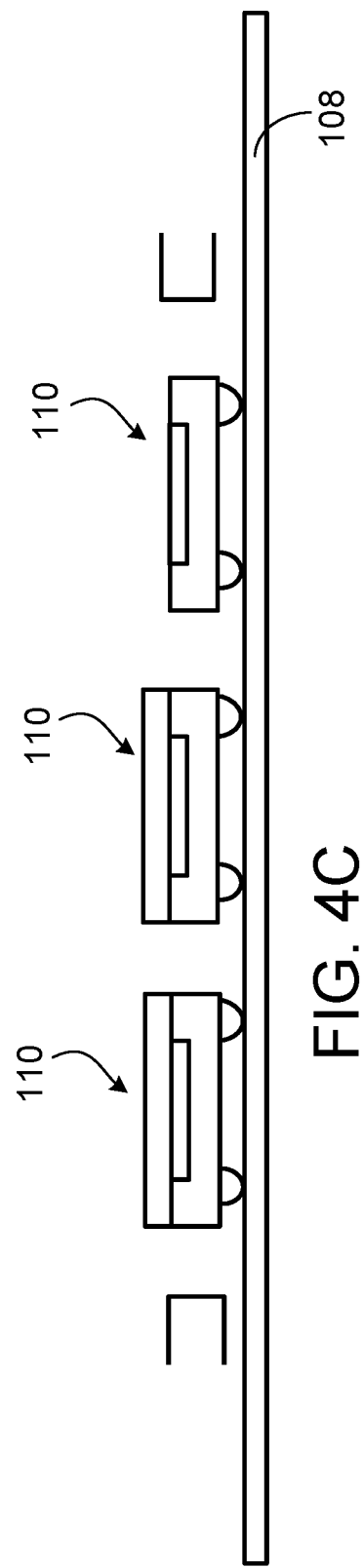

As illustrated in FIG. 4A, a silicon wafer 100 is provided in which integrated optoelectronic components 102 are formed. The wafer can be provided with electrical connections 104 (e.g., solder bumps or ball grid arrays) on its backside and also may include through-silicon via connections. Optical filters 106 then can be applied over some or all of the optoelectronic components. In some instances, optical filters may not be applied to any of the optoelectronic components 102. In some cases, a protective layer (e.g., composed of glass or other transparent material) may be applied, for example, to protect the optoelectronic components from dust or particles generated during subsequent dicing. External light emitters such as LEDs, laser diodes, or VCSELS may be mounted on the silicon wafer as well. Next, as shown in FIG. 4B, a support wafer 108 is applied to support the silicon wafer 100, and, as indicated by FIG. 4C, the wafer is separated (e.g., by dicing) into multiple individual silicon device 110 each of which includes at least one optoelectronic component 102.

Figure 4D:
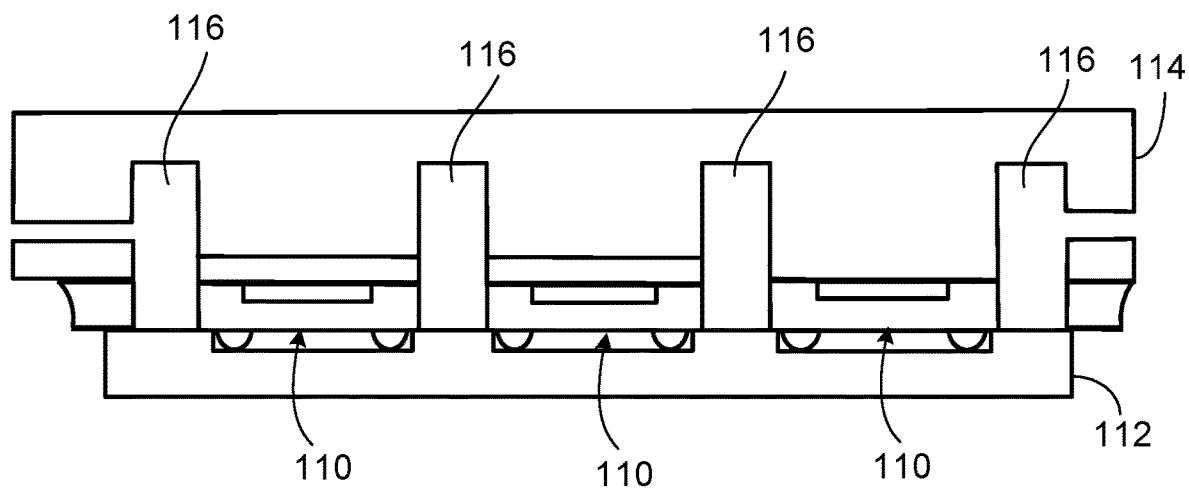
Figure 4E:
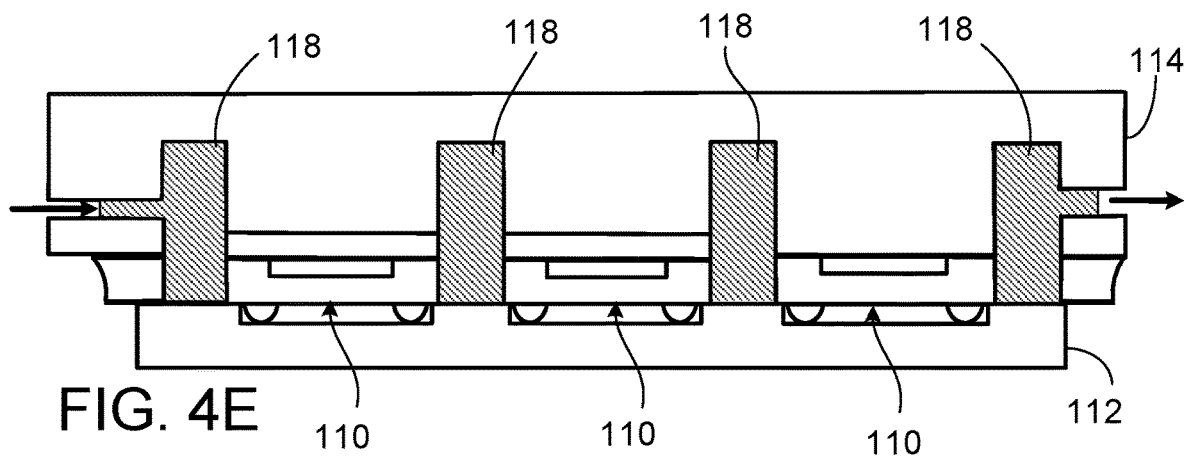
Figure 4F:
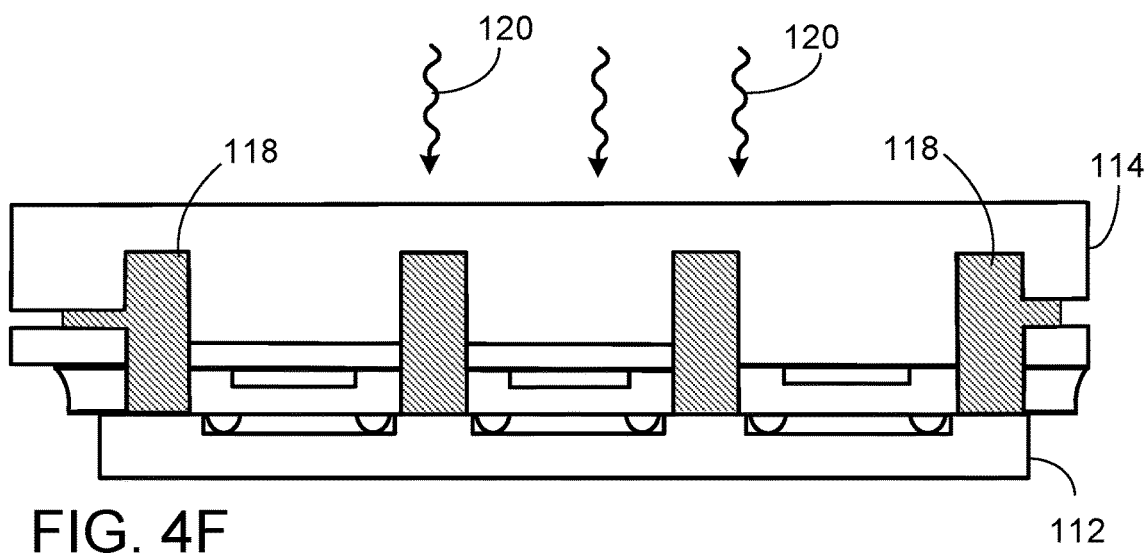

The silicon devices 110 can be removed from the support wafer 108 and placed on a lower vacuum injection tool 112 (see FIG. 4D). An upper vacuum injection tool 114 is applied to the devices 110 as well. When brought into contact with the silicon device2 110 as shown in FIG. 4D, the vacuum injection tools 112, 114 define spaces 116 around the silicon devices 110. A spacer material (e.g., epoxy with a non-transparent filler) 118 is injected into the spaces 116 as illustrated, for example, in FIG. 4E, and subsequently is cured, for example, by ultra-violet (UV) radiation 120 and/or thermal treatment (see FIG. 4F).

Figure 4G:
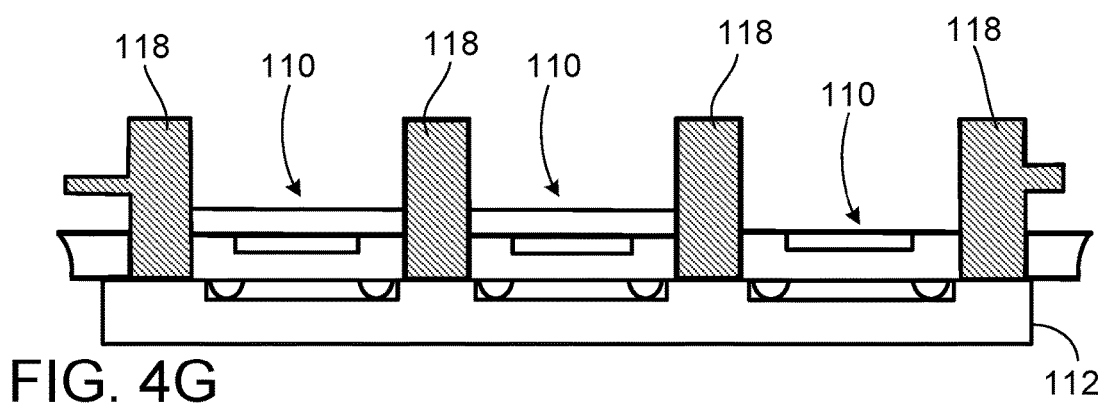

After the spacer material 118 is cured, the upper tool 114 can be removed. The resulting structure can remain on the lower tool 112, which serves as a support structure during some of the subsequent fabrication steps (see FIG. 4G). For example, a wafer-level optics assembly 122 can be attached (e.g., by adhesive) to the free end of the spacer 118 (see FIG. 4H). In this example, the waver-level optics assembly 122 includes transparent windows 124 formed in through-holes of a non-transparent PCB wafer 126. The optics assembly 122 can include one or more beam shaping elements (e.g., lenses) 128 formed (e.g., by a replication technique) on each of the transparent windows 124 to help focus incoming light onto the corresponding light detection element(s). Next, as indicated by FIG. 4I, the resulting structure is separated (e.g., along dicing lines 130) into individual optoelectronic modules each of which includes a single optical channel or an array of channels. The modules then can be removed from the lower support tool 112.

Figure 5:
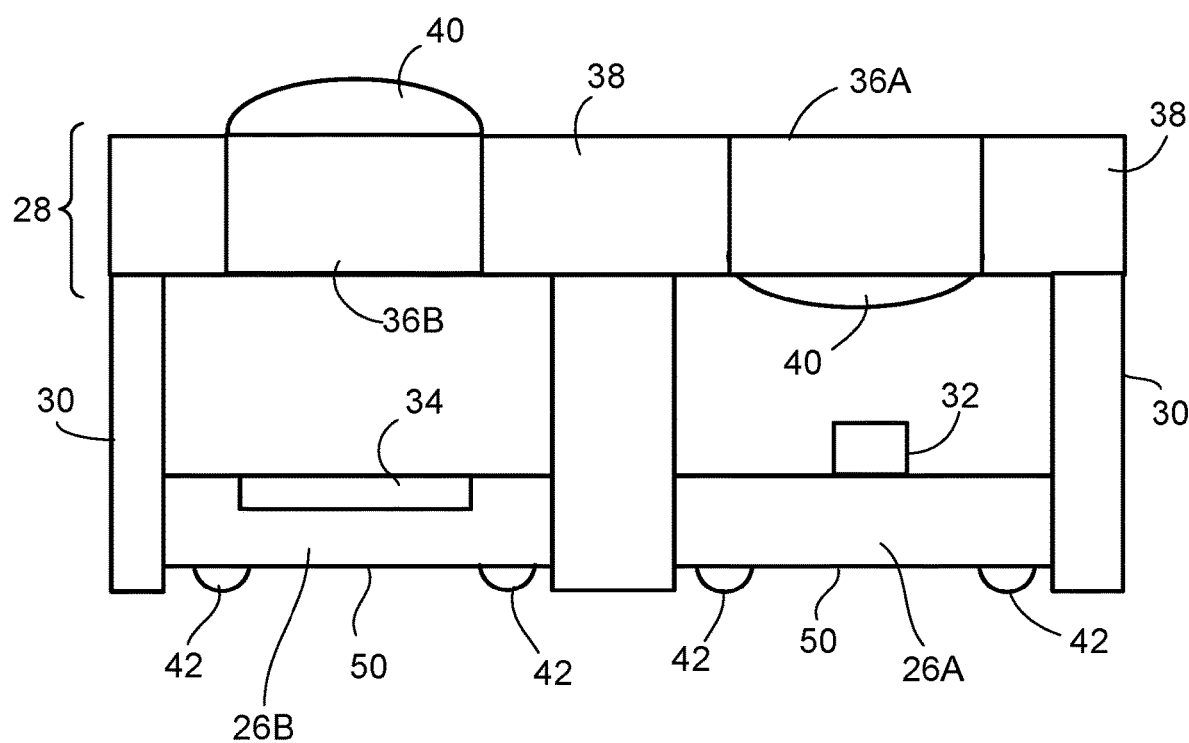
FIG. 5 is a further example of an optoelectronic module.

Various modifications to the foregoing method and modules can be implemented. For example, although in some cases the bottom of the spacers 30 may be substantially flush with the bottom of the silicon substrates 26A, 26B, in other cases, the spacers may protrude somewhat beyond the bottom of the silicon substrate(s) (see FIG. 5). In particular, the spacers 30 may extend beyond the lower surface 50 of the silicon substrate(s) on which the external conductive contacts 42 are located.

Figure 6A:
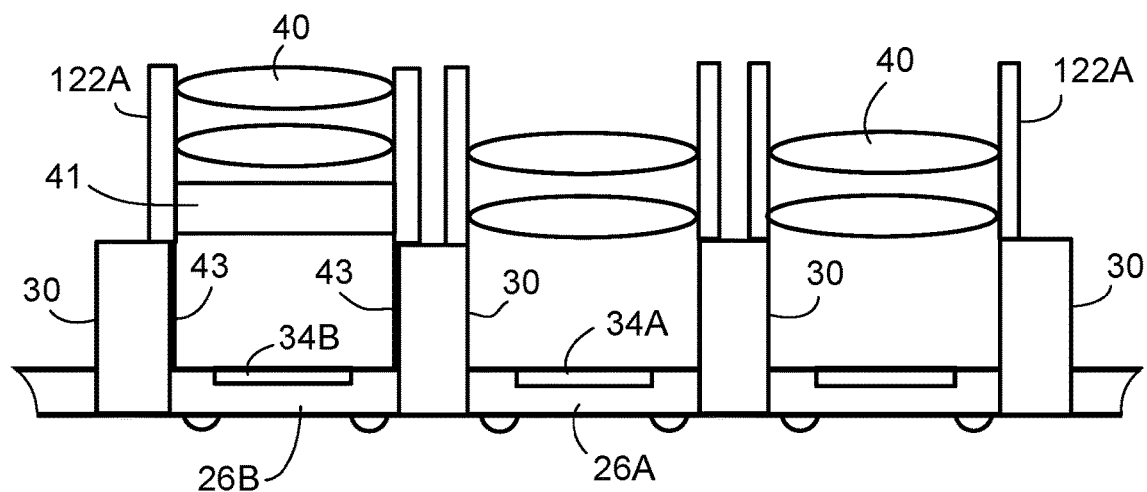
FIGS. 6A and 6B illustrate example of modules having different types of optics assemblies.

Various types of optics assemblies can be attached to the spacers 30. For example, instead of the wafer-level optics assembly 122 of FIG. 4H, a respective lens barrel 122A with appropriate lenses 40 can be provided for each channel (see FIG. 6A). In some cases, an autofocus mechanism 41 can be included, for example, in the lens barrel 122A. The autofocus mechanism can be implemented, for example, as a tunable lens or a piezo-electric element. Electrical connections 43 from the autofocus mechanism 41 to the silicon substrate can be provided, for example, along the surface of the spacer 30 or as through-spacer connections. The auto-focus mechanism 41 can be used alone or in conjunction with a glass optical element and/or the customizable vertical alignment features to provide very accurate and precise optical performance for the module.

Figure 6B:
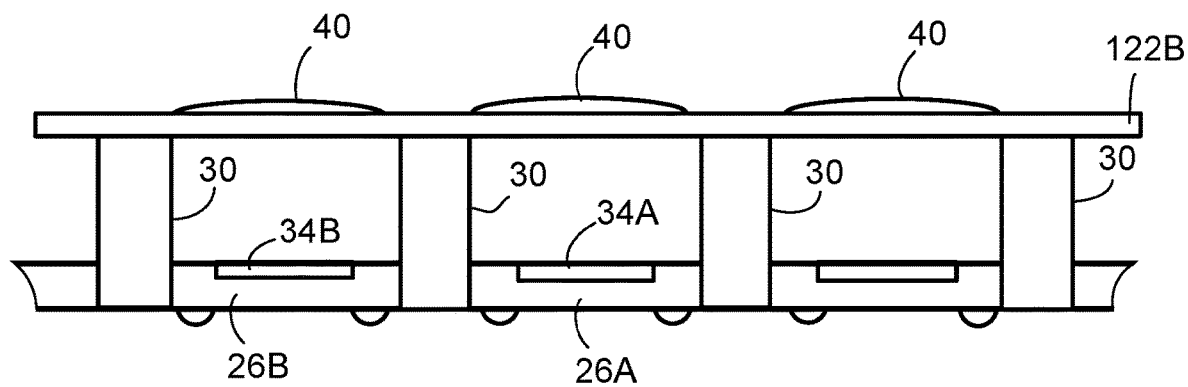

Further, in some cases a laterally contiguous lens array wafer 122B can be provided as part of the optics assembly (see FIG. 6B). In the latter case, a single contiguous lens array wafer may 122B span across the entire array of channels. Such an arrangement can be particularly advantageous, for example, when all of the channels have the same height.

Figure 7A:
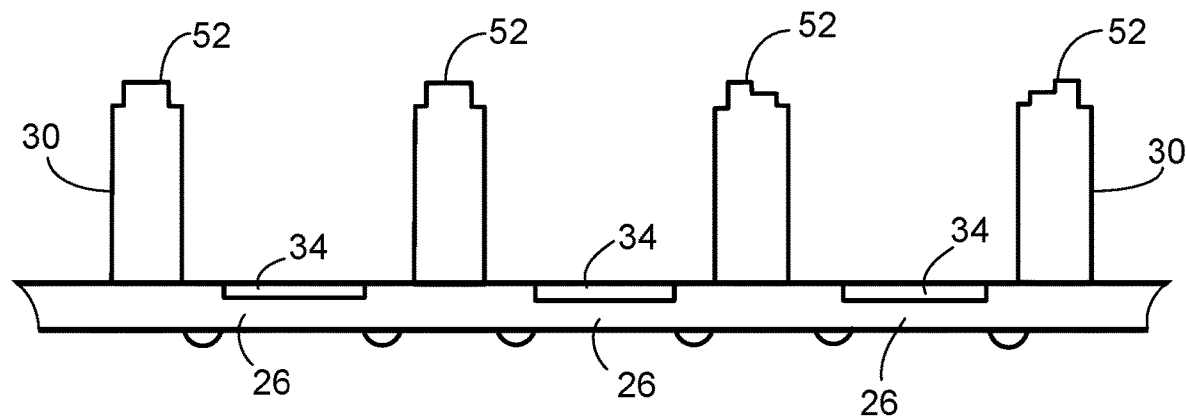
FIGS. 7A and 7B illustrate an example of modules having machine-able spacer features.
Figure 7B:
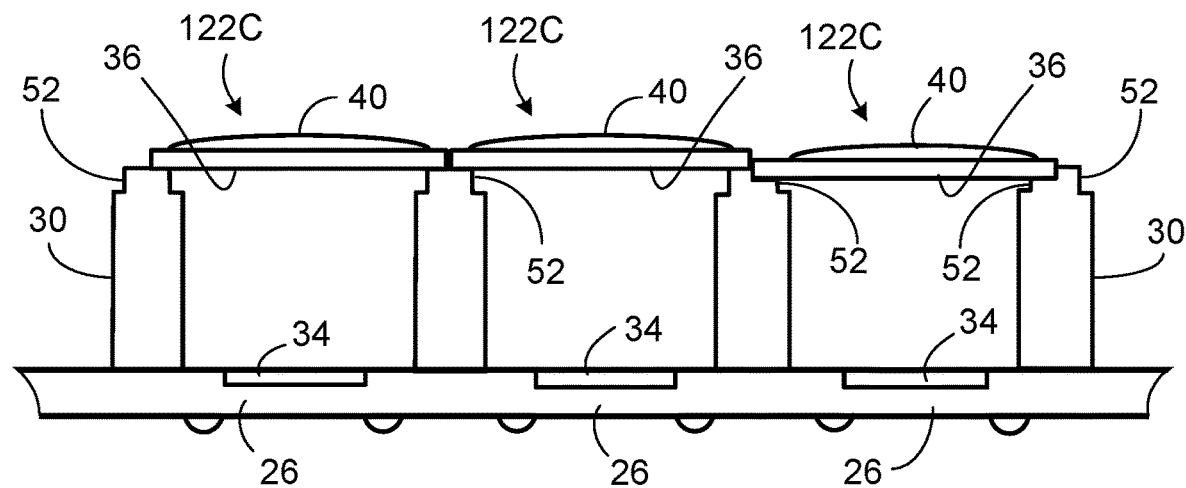

On the other hand, in some cases, it may be desirable to position the optical assembly for some of the channels at a height different from that of other channels. Such a situation may be helpful in providing focal length correction during the fabrication process. For example, prior to attaching an optics assembly over a particular channel, optical measurement(s) can be made to determine the extent to which the channel's focal length deviates from a specified target value. If the focal length needs to be corrected, one way of providing the correction is to adjust the height of the spacer through mechanical machining. As shown, for example, in FIG. 7A, the spacers 30 can include machine-able features 52 at their free ends. The free end of the spacer 30 for the particular channel can be micro-machined so as to achieve a specified focal length when an optics assembly 122C is attached to the spacer (see FIG. 7B). The optics assembly 122C then can be positioned over the channel, for example, using pick-and place equipment. In some instances, each optics assembly 122C includes a lens 40 and cover glass 36, only a lens 40, or only a cover glass 36. As shown in FIG. 7B, instead of contiguous lens array, the result is a non-contiguous lens array, which allows the optics assembly for each channel to be placed at a different height, if needed. In some cases, this process can result in a multi-channel module in which the optics assembly for one channel is at a height slightly different from the optics assembly for another channel.

Figure 8:
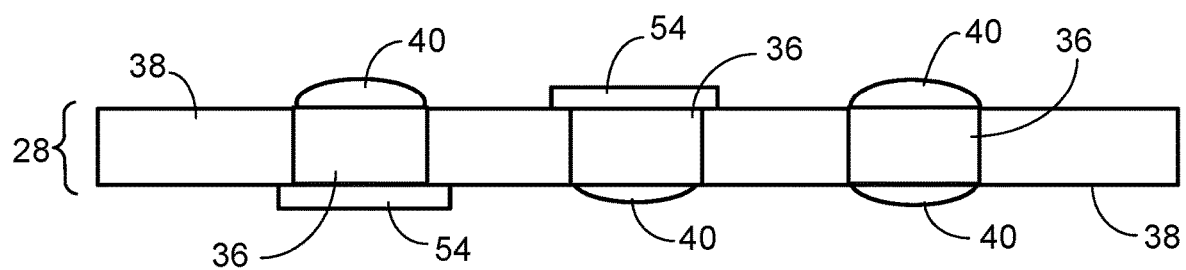
FIG. 8 is an example of an optics assembly that includes focal length correction layers.

Instead of, or in addition to, micromachining the height of the spacer 30 to adjust a channel's focal length, in some cases, a focal length correction layer 54 is provided (e.g., on a surface of the or cover glass 36, or on a surface of the lens wafer 38 as illustrated in FIG. 8). The thickness of the focal length correction layer 54 can be adjusted, for example, by exposing the layer to radiation so as to achieve a specified focal length for the channel. Thus, some channels may include micro-machined spacer features 52 and/or a focal length correction layer 54. Other channels may include neither of the foregoing features. After micro-machining the height of the spacer(s) 30 and/or adjusting the thickness of the focal length correction layer 54, an optics assembly can be attached to the spacer.

Figure 9A:
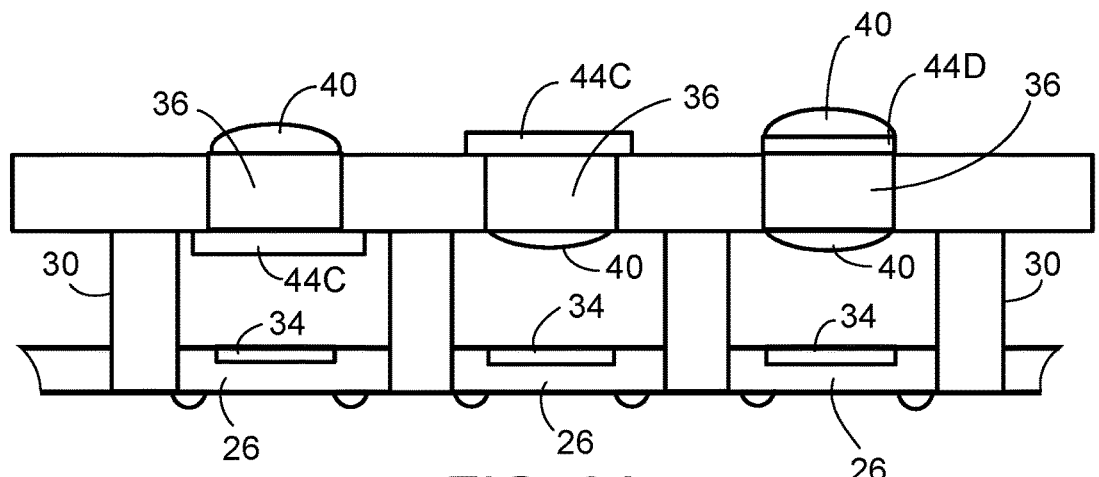
FIGS. 9A and 9B illustrate examples of optoelectronic modules having optical filters.
Figure 9B:
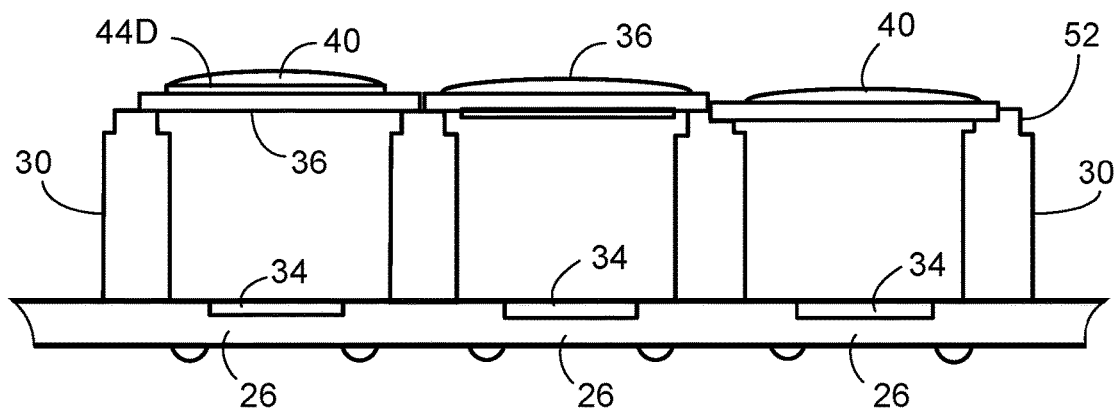

As previously described, optical filters can be provided for one or more of the channels. In some implementations, instead of, or in addition to, providing a filter directly on the optoelectronic device (e.g., 34A), a filter 44C can be provided on a surface of the lens assembly wafer 38 (FIG. 9A) or on the surface of the cover glass 36 (FIG. 9B). In some cases, an optical filter 44D is integrated into the optics assembly (FIGS. 9A and 9B).

As used in this disclosure, the terms "transparent," "non-transparent" and "transmissive" are made with reference to the particular wavelength(s) emitted by or detectable by the devices in the module. Thus, a particular feature, for example, may be considered "non-transparent" even though it may allow light of other wavelengths to pass through.

The modules described here can be useful, for example, as proximity sensor modules or as other optical sensing modules, such as for gesture sensing, recognition or imaging. The modules may be integrated into a wide range of small electronic devices, such as smart phones, bio devices, mobile robots, surveillance cameras, camcorders, laptop computers, and tablet computers, among others.

Various modifications can be made within the spirit of the foregoing description. Accordingly, other implementations are within the scope of the claims.

What is claimed is:

1. A method comprising:

placing a first wafer comprising optoelectronic components on a first vacuum injection tool;

applying a second vacuum injection tool over the first wafer such that the first and second vacuum injection tools define spaces separating channels from one another, wherein each of the channels is associated with a respective one of the optoelectronic components;

injecting an epoxy into the spaces to form a spacer that extends beyond a surface of the first wafer, the spacer having a free end;

subsequently machining portions of the free end of the spacer so that different regions of the spacer extend different amounts beyond the surface of the first wafer;

subsequently placing optics assemblies on the free end of the spacer so as to obtain a resulting structure in which each of the optics assemblies is disposed over a different respective one of the optoelectronic components, wherein at least some of the optics assemblies are disposed at a distance from the first wafer that differs from a distance at which other ones of the optics assemblies are disposed; and separating the resulting structure into a plurality of optoelectronic modules each of which includes at least one of the optoelectronic components and at least one of the optics assemblies.

2. The method of claim 1 further including:

performing optical measurements of the optoelectronic components;

wherein machining portions of the free end of the spacer changes how far different regions of the spacer extend beyond the surface of the first wafer, an amount of the machining at each respective portion being based, at least in part, on results of the optical measurements.

3. The method of claim 2 wherein the amount of machining of the spacer at each respective region is based on a target focal length.

4. The method of claim 1 wherein separating the resulting structure into a plurality of optoelectronic modules includes dicing along lines passing through the spacer in a direction perpendicular to the first wafer.

5. The method of claim 1 wherein injecting an epoxy into the spaces to form a spacer includes injecting an epoxy with a non-transparent filler.

6. The method of claim 1 wherein the portions of the free end of the spacer are machined to correct a focal length of one or more of the channels.

7. The method of claim 1 including placing the optics assemblies on the free end of the spacer by pick-and-place equipment.

8. The method of claim 1 including separating the resulting structure into a plurality of optoelectronic modules each of which includes a plurality of optoelectronic components and a corresponding optics assembly disposed over each respective one of the optoelectronic components, and wherein the optics assemblies are disposed at different distances above the respective optoelectronic components.

9. The method of claim 1 further including providing a focal length correction layer to adjust a focal length of one or more of the channels.

* * * * *